United States Patent
Kesper

(10) Patent No.: US 9,962,925 B2
(45) Date of Patent: May 8, 2018

(54) STENCIL FOR FORMING SURFACE STRUCTURES BY ETCHING

(71) Applicant: AKK GmbH, Krefeld (DE)

(72) Inventor: Peter Kesper, Krefeld (DE)

(73) Assignee: AKK GmbH, Krefeld (DE)

( * ) Notice: Subject to any disclaimer, the term of this patent is extended or adjusted under 35 U.S.C. 154(b) by 0 days. days.

(21) Appl. No.: 15/039,125

(22) PCT Filed: Nov. 24, 2014

(86) PCT No.: PCT/EP2014/075404
§ 371 (c)(1),
(2) Date: May 25, 2016

(87) PCT Pub. No.: WO2015/075231
PCT Pub. Date: May 28, 2015

(65) Prior Publication Data
US 2016/0361916 A1     Dec. 15, 2016

(30) Foreign Application Priority Data
Nov. 25, 2013   (EP) ..................................... 13194261

(51) Int. Cl.
*B41F 15/34*     (2006.01)
*B41F 23/00*     (2006.01)
(Continued)

(52) U.S. Cl.
CPC .............. *B41F 15/34* (2013.01); *B41F 19/00* (2013.01); *B41F 23/00* (2013.01); *B41F 31/00* (2013.01);
(Continued)

(58) Field of Classification Search
None
See application file for complete search history.

(56) References Cited

U.S. PATENT DOCUMENTS

| 4,648,174 A | 3/1987 | Temple et al. |
| 6,145,980 A * | 11/2000 | Wang ........................ B41J 3/28 347/104 |

(Continued)

FOREIGN PATENT DOCUMENTS

| CN | 101201543 A | 6/2008 |
| CN | 101443703 A | 5/2009 |

(Continued)

*Primary Examiner* — Jiong-Ping Lu
(74) *Attorney, Agent, or Firm* — The Webb Law Firm

(57) ABSTRACT

The invention relates to a stencil for forming surfaces structures by etching, a method for producing a stencil for forming surfaces structures by etching, a printing machine for producing a stencil for forming surface structures by etching, and a method for forming surface structures by etching. A known stencil for forming surface structures by etching includes an etching-resistant stencil layer. The stencil layer can be transferred to the surface to be structured, and the stencil layer can after an etching treatment be partially removed from the surface to be structured, and is elaborated and developed in that the stencil layer includes at least two partial regions and that at least two partial regions can be removed independently of one another from the surface to be structured.

9 Claims, 2 Drawing Sheets

(51) Int. Cl.
*B41M 7/00* (2006.01)
*B41F 19/00* (2006.01)
*B41F 31/00* (2006.01)
*G03F 7/12* (2006.01)
*G03F 7/24* (2006.01)
*C23F 1/00* (2006.01)
*B29C 45/37* (2006.01)

(52) U.S. Cl.
CPC ............ *B41M 7/00* (2013.01); *C23F 1/00* (2013.01); *G03F 7/12* (2013.01); *G03F 7/24* (2013.01); *B29C 45/372* (2013.01); *B41M 7/0081* (2013.01); *B41M 2205/00* (2013.01)

(56) References Cited

U.S. PATENT DOCUMENTS

2003/0034328 A1    2/2003    Lu
2007/0128748 A1    6/2007    Leung Ki
2010/0006542 A1*    1/2010    Reichert ............... B44B 5/026
                                                                                                                216/48
2011/0024392 A1    2/2011    Sato et al.
2011/0076448 A1    3/2011    Agantval et al.
2013/0286439 A1    10/2013    Ohnishi

FOREIGN PATENT DOCUMENTS

| | | |
|---|---|---|
| DE | 2133230 A1 | 1/1972 |
| DE | 102006022722 A1 | 11/2007 |
| EP | 1004440 A2 | 5/2000 |
| GB | 375774 | 6/1932 |
| JP | S57169090 A | 10/1982 |
| JP | 58-203054 * 11/1983 | ............... B41B 1/00 |
| JP | S58203054 A | 11/1983 |
| WO | 9802924 A2 | 1/1998 |
| WO | 2005045098 A1 | 5/2005 |

* cited by examiner

STENCIL FOR FORMING SURFACE STRUCTURES BY ETCHING

CROSS-REFERENCE TO RELATED APPLICATIONS

This application is the United States national phase of International Application No. PCT/EP2014/075404 filed Nov. 24, 2014, and claims priority to European Patent Application No. 13194261.7 filed Nov. 25, 2013, the disclosures of which are hereby incorporated in their entirety by reference.

BACKGROUND OF THE INVENTION

Field of the Invention

The present invention relates to a stencil for forming surface structures by etching, a method for producing such a stencil, a printing machine for producing such a stencil as well as a method for forming surface structures by etching.

Description of Related Art

Stencils known from the prior art for forming surface structures by etching comprise an etch-resistant stencil layer, wherein the stencil layer can be transferred, for example by rubbing, to the surface to be structured and wherein, after an etching treatment of the surface to be structured, the stencil layer can be at least partially removed.

Such stencils are used to produce a structured image, for example the reproduction of a textured leather surface, on metal surfaces, in particular surfaces of injection moulded tools, which in the subsequent injection moulding is transferred to the surface of the injection moulded plastic part.

For this purpose, an etch-resistant stencil layer—normally from a stencil carrier—is transferred to the metal surface. This is usually carried out by placing the stencil carrier, formed for example as a paper or film, on the surface to be structured and the stencil layer is then transferred from the stencil carrier by rubbing, i.e. by applying pressure to the stencil carrier in the direction of the surface to be structured. This is a procedure that is normally performed manually since the surfaces to be structured usually have a three-dimensional shape that does not allow or at least greatly complicates a mechanical transfer of the stencil layer.

When the stencil layer has been transferred to the surface to be structured, the stencil layer thus now forms an acid-resistant layer that covers specific regions of the surface to be structured. If the work piece, for example the injection mould, is now exposed to an acid bath, the reactivity of the uncovered surface of the work piece thus leads to a removal of material as a result of the oxidation initiated by the acid.

Such surface structures formed by etching techniques are very widespread, since in particular the surface of injection-moulded plastic parts substantially shapes the overall appearance of the end product. The requirements placed on the structural images of surface structures produced by etching techniques therefore increase accordingly. In many cases these can only be satisfied if the etching for forming the surface structures takes place in several stages. In this connection a part of each step is the transfer of a stencil layer to the surface to be structured further (with the second step) and a subsequent further treatment in an acid bath. Together with the requirements placed on the final structural image the requirements on the transfer of the stencil layer in a second or in further steps also become more stringent. The effort and expenditure involved in the normally manually performed transfer of a stencil layer to a surface that is already structured by etching is therefore considerable.

To produce a stencil for forming surface structures by etching it is known to use a method in which an etch-resistant stencil layer is applied to a stencil carrier by means of a dot matrix printer. By using a dot matrix printer, i.e. a printer that generates its printed image by composing individual image points, it is possible in a simple way to produce the stencil layer in almost any arbitrary shape.

Known printing machines for producing a stencil for forming surface structures by etching comprise at least one dot matrix printer head and at least one receptacle for a stencil carrier, in which the dot matrix printer head prints a stencil layer on the stencil carrier. In this connection various materials are used to produce the stencil layer. It is known for example to use UV-curable ink or wax.

As already mentioned methods are known for forming surface structures by etching, in which a stencil layer is transferred from a stencil carrier to the surface to be structured and the surface to be structured undergoes an etching treatment after the stencil layer has been applied.

An object of the present invention is to elaborate and develop the known stencils for forming surface structures by etching, the known methods for producing a stencil for forming surface structures by etching, the known printing machines for producing a stencil for forming surface structures by etching and also the known methods for forming surface structures by etching, in which the formation of complicated, multilayer surface structures involving at least two successive etching treatments is significantly simplified and accelerated.

SUMMARY OF THE INVENTION

According to a first teaching of the invention the known stencils for forming surface structures by etching are according to the invention elaborated and developed in such a way that the stencil layer comprises at least two partial regions and that at least two partial regions can be removed independently of one another from the surface to be structured. By virtue of the fact that at least one partial region of the stencil layer according to the invention can be removed independently of another partial region of the stencil layer according to the invention from the surface to be structure, it is ensured that after a single transfer of the stencil layer according to the invention to the surface to be structured, a two-stage or multistage etching treatment can take place.

In this connection, between two etching treatments at least one partial region of the stencil layer is removed from the surface to be structured, for example by using selective solvents. The elaboration according to the invention of the stencil thus permits a multistage structuring for the formation of complicated structural images without having to transfer a new stencil layer in each step to the surface to be structured further. The partial region of the stencil layer remaining on the surface to be structured furthermore covers in the following etching treatment partial regions of the surface to be structured and thus permits the formation of complicated structural images.

The first teaching of the invention involves an advantageous embodiment in which a partial region of the stencil layer comprises a UV-curable ink. The use of UV-curable inks to produce stencils for forming surface structures by etching is a known and proven technique. Also, the methods for removing cured UV-curable inks from the surfaces to be structured are known and proven.

The use of UV-curable inks to form a first partial region of a stencil layer elaborated according to the invention can be combined particularly advantageously if a partial region of the stencil layer comprises a paste-like ink. The solvent systems that are used to dissolve a cured UV-curable ink do not attack the partial regions containing a paste-like ink. Consequently two partial regions consisting on the one hand of a UV-curable ink and on the other hand of a paste-like ink can be removed independently of one another from the surface to be structured.

The known methods for producing a stencil for forming surface structures by etching are, according to a second teaching of the invention, elaborated and developed in that in at least two partial regions of the stencil layer, stencil materials that can be removed independently of one another from the surface to be structured are applied by means of a dot matrix printer. With regard to the advantages of this elaboration according to the invention, reference is made to the advantages described in connection with the elaboration according to the invention of a stencil for forming surface structures by etching.

The known printing machines for producing a stencil for forming surface structures by etching are, according to a third teaching of the invention, elaborated and developed in that the at least one dot matrix printer head has feeders for at least two stencil materials that can be removed independently of one another from the surface to be structured. The use of one or more dot matrix printer heads that print simultaneously or successively in partial regions of the stencil layer at least two stencil materials that can be removed independently of one another from the surface to be structured, allows a simple computer-resources-assisted production of the desired stencils for forming surface structures by etching.

Finally, according to a fourth teaching of the invention, a known method for forming surface structures by etching is elaborated and developed in which, after a first etching treatment, a partial region of the stencil layer is removed and the surface to be structured undergoes at least a second etching treatment. As regards the advantages associated with this embodiment, reference is made to the advantages outlined in connection with the first teaching of the invention.

A method elaborated according to the fourth teaching of the invention for forming surface structures by etching is elaborated further in that after an etching treatment, a partial region of the stencil layer comprising a UV-curable ink is removed using caustic soda. Caustic soda is a solvent system that is suitable for removing cured UV-curable inks.

According to a second embodiment of the fourth teaching of the invention, after an etching treatment, a partial region of the stencil layer comprising a paste-like ink is removed with the aid of ethyl acetate. Whereas caustic soda removes UV-curable inks, caustic soda does not attack a paste-like ink. The paste-like ink can in the case of a two-stage etching treatment be subsequently removed by means of ethyl acetate.

There are a large number of possibilities and embodiments of the teachings according to the invention for improving a stencil for forming surface structures by etching, a method for producing a stencil for forming surface structures by etching, a printing machine for producing a stencil for forming surface structures by etching, and also a method for forming surface structures by etching.

DETAILED DESCRIPTION OF THE INVENTION

Figure 1A:
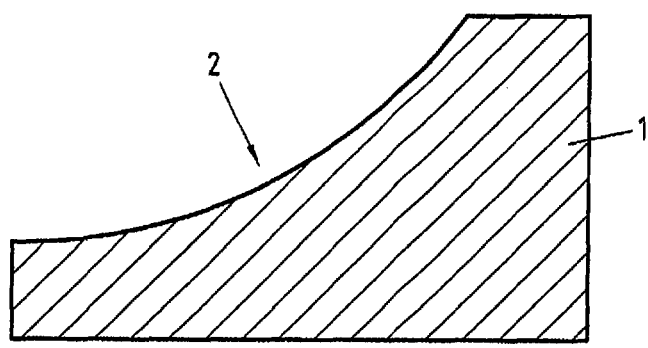
FIGS. 1a)-1f) show, by way of example the formation of a surface structure by etching using a stencil configured according to the invention.
Figure 1B:
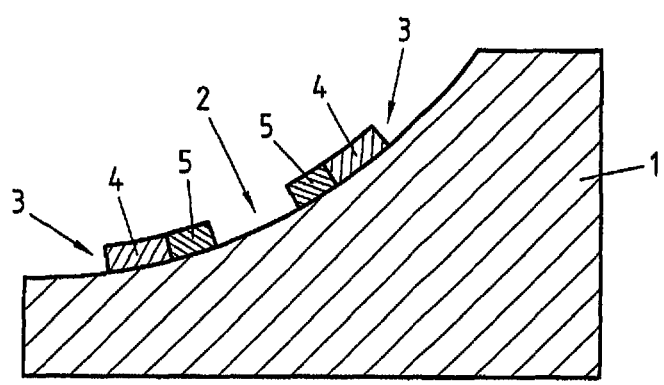

FIG. 1a) shows an untreated workpiece 1 with a surface 2 to be structured. As illustrated in FIG. 1b), a stencil layer 3, which according to the invention comprises partial regions, namely a first partial region 4 and a second partial region 5, is applied to the surface to be structured.

Figure 1C:
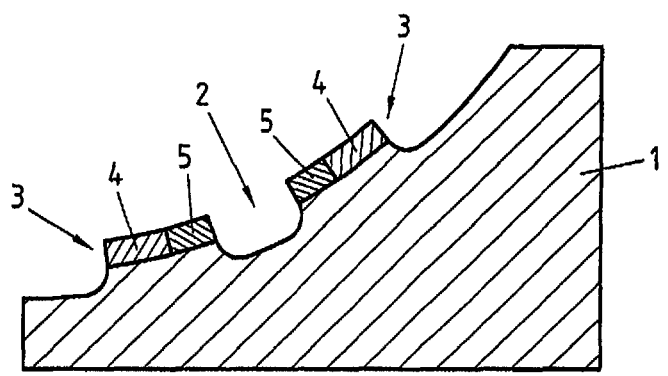

In a next step the surface 2 to be structured undergoes an etching treatment, whereby the surface 2, as can be seen from FIG. 1c), is stripped, i.e. structured, in the regions not covered by the stencil layer 3. Since the first partial region 4 as well as the second partial region 5 of the stencil layer 3 are etch-resistant, these are not removed by the etching treatments.

Figure 1D:
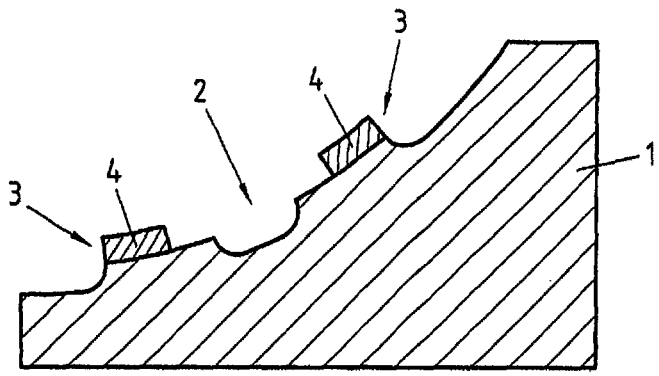

In a next step at least the stencil layer 3 in the illustrated exemplary embodiment is subjected to a treatment with caustic soda. Since in the illustrated exemplary embodiment the second partial region 5 consists substantially of a UV-curable ink, this second partial region 5 is removed by the treatment of the caustic soda. The result is shown in FIG. 1d).

Figure 1E:
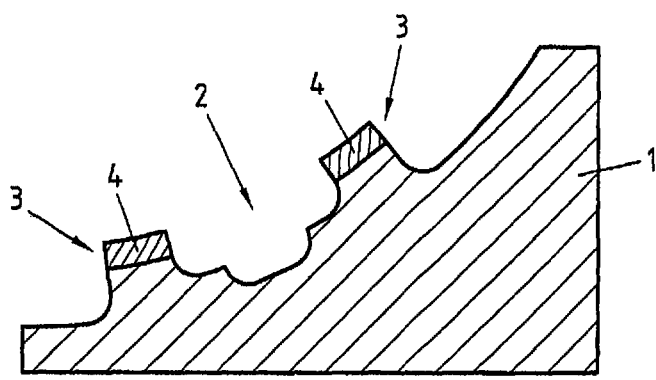

The structure of the surface 2 of the workpiece 1 after a second etching treatment, during which simply the first partial region 4 of the stencil layer remains on the surface 2, is illustrated in FIG. 1e).

Figure 1F:
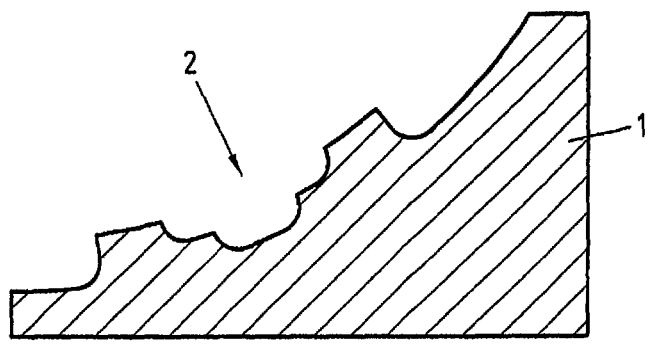

Finally, the resultant workpiece 1 with a structured surface 2 after removal of the first partial region 4 of the stencil layer 3 is illustrated in FIG. 1f). In the exemplary embodiment described here the first partial region 4 of the stencil layer 3 consists substantially of a paste-like ink, which had been removed in the final step with ethyl acetate.

It can be seen from FIG. 1f) that with a stencil elaborated according to the invention it is possible with only a single transfer of a stencil layer 3 comprising two partial regions 4, 5, to create on the work-piece 2 a complex surface structure by etching treatments. To this end, according to the invention a stencil layer 3 need be applied only once to the surface 2 of the workpiece 1 to be structured. After a first etching treatment the second partial region 5 of the stencil layer is removed and a further etching treatment is carried out, which now acts also on the regions of the surface 2 that had previously been covered by the second partial region 5 of the stencil layer 3. Finally, also the first partial region 4 of the stencil layer 3 is removed from the workpiece 1.

A stencil layer according to the invention can comprise two or more partial regions. It is also possible to process surfaces that are particularly complicated to structure, two or more times with stencils configured according to the invention.

The invention claimed is:

1. A stencil for forming surface structures by etching, with an etch-resistant stencil layer, wherein the stencil layer can be transferred by means of rubbing to the surface to be structured and wherein, after an etching treatment of the surface to be structured, the stencil layer can be at least partially removed, wherein the stencil layer comprises at least two partial regions and the at least two partial regions can be removed independently of one another from the surface to be structured.

2. The stencil according to claim 1, wherein a partial region of the stencil layer comprises a UV-curable ink.

3. The stencil according to claim 2, wherein a partial region of the stencil layer comprises a paste comprising ink.

4. The stencil according to claim 1, wherein a partial region of the stencil layer comprises a paste comprising ink.

5. A method for producing a stencil for forming surface structures by etching, wherein an etch-resistant stencil layer is applied by means of a dot matrix printer to a stencil carrier, wherein in at least two partial regions of the stencil layer, stencil materials that can be removed independently of one another from the surface to be structured are applied by means of a dot matrix printer, wherein the stencil layer can be transferred by means of rubbing to the surface to be structured.

6. A method for forming surface structures by etching, wherein a stencil layer is transferred by means of rubbing from a stencil carrier to the surface to be structured and the surface to be structured undergoes an etching treatment with the applied stencil layer, wherein after a first etching treatment, a partial region of the stencil layer is removed and the surface to be structured undergoes at least a second etching treatment.

7. The method according to claim 6, wherein after an etching treatment, a partial region of the stencil layer comprising a UV-curable ink is removed by means of caustic soda.

8. The method according to claim 7, wherein after an etching treatment, a partial region of the stencil layer comprising a paste comprising ink is removed by means of ethyl acetate.

9. The method according to claim 6, wherein after an etching treatment, a partial region of the stencil layer comprising a paste comprising ink is removed by means of ethyl acetate.

* * * * *